US006693574B2

(12) United States Patent  
Yamamura

(10) Patent No.: US 6,693,574 B2  
(45) Date of Patent: Feb. 17, 2004

(54) D/A CONVERTER AND DELTA-SIGMA D/A CONVERTER

(75) Inventor: Ken Yamamura, Sagamihara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 10/394,155

(22) Filed: Mar. 24, 2003

(65) Prior Publication Data

US 2003/0179122 A1 Sep. 25, 2003

(30) Foreign Application Priority Data

Mar. 25, 2002 (JP) ........................................ 2002-083775

(51) Int. Cl.$^7$ .............................................. H03M 2/66
(52) U.S. Cl. ........................ 341/150; 341/143; 341/144
(58) Field of Search ................................. 341/143, 144, 341/150

(56) References Cited

U.S. PATENT DOCUMENTS

| 5,008,674 A | * | 4/1991 | Da Franca et al. | ......... | 341/150 |
| 5,162,801 A | * | 11/1992 | Powell et al. | ............... | 341/150 |
| 5,696,509 A | * | 12/1997 | Maejima | ..................... | 341/150 |
| 5,892,473 A | * | 4/1999 | Shin | ........................... | 341/150 |
| 5,923,275 A | * | 7/1999 | Kalb | ........................... | 341/150 |
| 5,990,819 A | * | 11/1999 | Fujimori | ..................... | 341/150 |
| 6,169,509 B1 | * | 1/2001 | Abe | ............................ | 341/150 |

OTHER PUBLICATIONS

F. Ichiro; "D/A Converter and Delta Sigma Type D/A Converter"; Patent Abstracts of Japan, of JP 11055121 A, Feb. 26, 1999.

* cited by examiner

Primary Examiner—Michael Tokar  
Assistant Examiner—Khai M. Nguyen  
(74) Attorney, Agent, or Firm—Finnegan, Henderson, Farabow, Garrett & Dunner, L.L.P.

(57) ABSTRACT

When a clock $\phi 1$ is in high state, based on a digital signal, capacitive elements C11 to C1$i$ are connected between a reference voltage Vr+ or Vr− and a sampling ground V1 to hold a charge corresponding to difference between the reference voltage and sampling ground V1 while capacitive elements C21 to C2$i$ are connected between a reference voltage Vr+ or Vr− and a sampling ground V2 to hold a charge corresponding to difference between the reference voltage and sampling ground V2. When a clock $\phi 2$ is in high state, the capacitive elements C11 to C1$i$ and C21 to C2$i$ are connected, in parallel with a feedback capacitive element Cfb, between an input terminal and output terminal of an operational amplifier 100.

To obtain a D/A converter which operates at a lower supply voltage and produces output signals low in harmonic components and noise components.

8 Claims, 7 Drawing Sheets

D/A CONVERTER AND DELTA-SIGMA D/A CONVERTER

BACKGROUND OF THE INVENTION

1. Field of the Invention

The present invention relates to D/A converters which convert digital signals into analog signals and are used for signal processing in the field of audio equipment and the like. In particular, it relates to a switched capacitor D/A converter capable of operating at a low supply voltage and outputting analog signals low inharmonic components and noise components, and to a delta-sigma D/A converter using thereof.

2. Description of the Prior Art

In an audio area, a so-called delta-sigma D/A converter, for example, such as the one shown in FIG. 6 has been proposed as a signal converter which converts high-bit (16-bit) digital input signals used, for example, in compact disks (CDs) into analog output signals. The signal converter 10 interpolates high-bit (16-bit) digital input signals 64 to 128 times using a digital filter 11. Then, a digital delta-sigma modulator 12 converts the interpolated digital signals into lower-bit (lower-resolution) digital signals. Then, a signal control circuit 13 converts the digital signals into digital data suitable for controlling a switched capacitor D/A converter 15 in the next stage, and the switched capacitor D/A converter 15 produces analog output signals.

Regarding the switched capacitor D/A converter 15, various types have been proposed. For example, a switched capacitor D/A converter 40 described in Japanese Patent Laid-Open No. 11-055121 applied by this applicant comprises an operational amplifier 100 whose output terminal and inverting input terminal are connected by a capacitive element Cfb and whose non-inverting input terminal is connected to an analog ground, as shown in FIG. 7. Also, it comprises capacitive elements C1 to Ci; a switch SB connected between the capacitive elements C1 to Ci and the inverting input terminal of the operational amplifier 100; switches SU1 to SUi which connect the right terminals of the respective capacitive elements C1 to Ci, i.e., the terminals connected with the switch SB, to the analog ground; switches SUG1 to SUGi which connect the left terminals of the capacitive elements C1 to Ci with one of reference voltages (Vr+ and Vr−); switches SY1 to SYi connected between the left terminals of the respective capacitive elements C1 to Ci and the output terminal of the operational amplifier 100; and a clock supplier 200 which supplies two types of clock φ1 and φ2.

The capacitive elements C1 to Ci hold charges which correspond to a predetermined reference voltage based on digital data during a first period and the capacitive elements C1 to Ci are connected between the inverting input terminal and output terminal of the operational amplifier 100 during a second period.

Specifically, when the clock φ1 is in high state, the capacitive element Cx is operated according to the polarity of digital data Sx (x=1 to i). For example, if the digital data Sx is "1," the capacitive element Cx is connected between the reference voltage Vr+ and analog ground and positive charges are sampled onto the capacitive element Cx. If the digital data Sx is "−1," the capacitive element Cx is connected between the reference voltage Vr− and digital ground and negative charges are sampled. When the clock φ2 is in high state, the capacitive element Cx is connected between the output terminal and inverting input terminal of the operational amplifier 100.

When the switched capacitor D/A converter 40 shown in FIG. 7 is implemented as a MOS integrated circuit and operated at a positive power supply potential VDD and a negative power supply potential 0 [V], a high reference voltage is used and so-called kT/C noise attributable to sampling by capacitive elements is reduced to maximize S/N ratio. Besides, to simplify configuration, the reference voltage Vr+ is set at VDD, the reference voltage Vr− is set at 0 [V], and the analog ground is set at the midpoint potential (½)·VDD of the supply voltage.

FIG. 8 shows potentials of various parts around the capacitive element Ci. In FIG. 8A, where the reference voltage Vr+ is selected, the switch SUGi which connects the capacitive element Ci with one of the reference voltages (Vr+ and Vr−) corresponds to a MOS switch Q1 consisting of a MOS transistor while the switch SUi which connects the capacitive element Ci to the analog ground corresponds to a MOS switch Q2. In FIG. 8B, where the reference voltage Vr− is selected, the switch SUi corresponds to a MOS switch Q3 while the switch SUGi corresponds to a MOS switch Q4.

If the MOS switches Q2 and Q3 connected to the analog ground consist of n-channel MOS transistors as shown in FIGS. 8A and 8B, the source potential is (½)·VDD. If the gate potential is VDD, the gate-source potential VGS of the MOS switches Q2 and Q3 is (½)·VDD.

However, if the MOS integrated circuit is operated at a low supply voltage, since the switches (Q2 and Q3, in this case) connected to the analog ground consist of MOS transistors, the MOS switches may not turn on and charges may not be able to be sampled onto the capacitive elements during the first period depending on relationship between the gate-source voltage VGS and a threshold voltage VT of the MOS transistors.

FIG. 9 shows correspondence between source potential and resistance (so-called ON resistance) when n-channel MOS transistors of the same size conduct at different supply voltages. In FIG. 9, the horizontal axis represents the source potential while the vertical axis represents the ON resistance. A characteristic line L1 has the lowest supply voltage VDD and the rightmost characteristic line has the highest supply voltage VDD. The ON resistances of the characteristic lines L1 to L3 at the source voltage of (½)·VDD are indicated by ○ marks.

As shown in FIG. 9, the ON resistance at the source voltage of (½)·VDD rises sharply as the supply voltage VDD lowers. Thus, in order to sample charges within a predetermined period of time, the size of the MOS transistors must be increased to lower the ON resistance.

However, increasing the size of the MOS transistors which compose switches will increase the feed-through noise produced when the gate voltage changes during sampling of charges and the switches are turned off. This will cause variations in the amount of charge among samplings, making the operational amplifier 100 produce harmonics and/or noise.

Even if changes in the threshold voltage VT due to a substrate effect are ignored, if the gate-source voltage, i.e., (½)·VDD, is not higher than the threshold voltage VT, MOS switches do not turn on, and thus the minimum operating supply voltage VDD is VDD=2·VT.

Similarly, if the switches connected to the analog ground consist of p-channel MOS transistors, since the MOS switches Q2 and Q3 in FIG. 8A are p-channel MOS transistors, the gate-source voltage VGS is (½)·VDD as with the above case. Thus, if (½)·VDD is not higher than the threshold voltage VT, the MOS switches Q2 and Q3 do not turn on, and thus the minimum operating supply voltage VDD is VDD=2·VT. Incidentally, the threshold voltage VT of p-channel MOS transistors is negative, and its absolute value is used here.

If the MOS switches Q2 and Q3 connected to the analog ground consist of an n-channel MOS transistor and p-channel MOS transistor connected in parallel, the gate-source voltage VGS of the MOS transistors is also (½)·VDD. Thus, if the gate-source voltage VGS lowers below the lower of the threshold voltages VT of the two MOS transistors which compose the MOS switches, MOS switches do not turn on, so the minimum operating supply voltage VDD is determined based on the lower of the threshold voltages VT. In short, the minimum operating supply voltage VDD is restricted by the threshold voltages VT of the MOS switches.

Thus, the object of the present invention is to provide D/A converters which can operate at a low supply voltage and can give good output.

BRIEF SUMMARY OF THE INVENTION

The present invention provides a D/A converter for converting a given digital signal into an analog signal, comprising: a first capacitive element for holding a charge corresponding to difference between a charge-holding supply voltage and a first reference voltage based on the given digital signal during a first period; a second capacitive element for holding a charge corresponding to difference between the charge-holding supply voltage and a second reference voltage different from the first reference voltage based on the given digital signal during the first period; and switching means which connects the first and second capacitive elements between an input terminal and output terminal of an operational amplifier during a second period.

With this configuration, during the first period, the first capacitive element holds the charge corresponding to the difference between the charge-holding supply voltage and first reference voltage while the second capacitive element holds the charge corresponding to the difference between the charge-holding supply voltage and second reference voltage based on the given digital signal, and then during the second period, the first and second capacitive elements are connected between the input terminal and output terminal of the operational amplifier. This makes it possible to implement a D/A converter which can operate at a lower supply voltage and produce output signals low in harmonic components and noise components.

Furthermore, for a fully differential configuration, the D/A converter may further comprise a third capacitive element for holding a charge corresponding to the difference between the charge-holding supply voltage and the first reference voltage during the first period and a fourth capacitive element for holding a charge corresponding to the difference between the charge-holding supply voltage and the second reference voltage during the first period. In that case, a second switch is needed to connect the third and fourth capacitive elements between a non-inverting input terminal and inverting output terminal of the operational amplifier.

The switching means are especially effective in reducing voltage if they comprise MOS transistors.

Preferably, the first reference voltage is a supply voltage and the second reference voltage is a ground voltage because this eliminates the need to generate an intermediate voltage.

The D/A converter described above can be used for a delta-sigma D/A converter which converts a digital signal sampled at a predetermined sampling frequency into an analog signal.

Specifically, the delta-sigma D/A converter comprises a digital filter which converts the digital signal into a second digital signal with a higher frequency than a sampling frequency by interpolating it; a digital delta-sigma modulator which converts the second digital signal into a lower-bit third digital signal using noise shaping; and a D/A converter which performs digital-analog conversion, wherein this D/A converter may be the D/A converter described above. The delta-sigma D/A converter may also be fully differential.

DETAILED DESCRIPTION OF THE PREFERRED EMBODIMENTS

The present invention will be described with reference to the drawings. To begin with, a first embodiment will be described.

Figure 1:
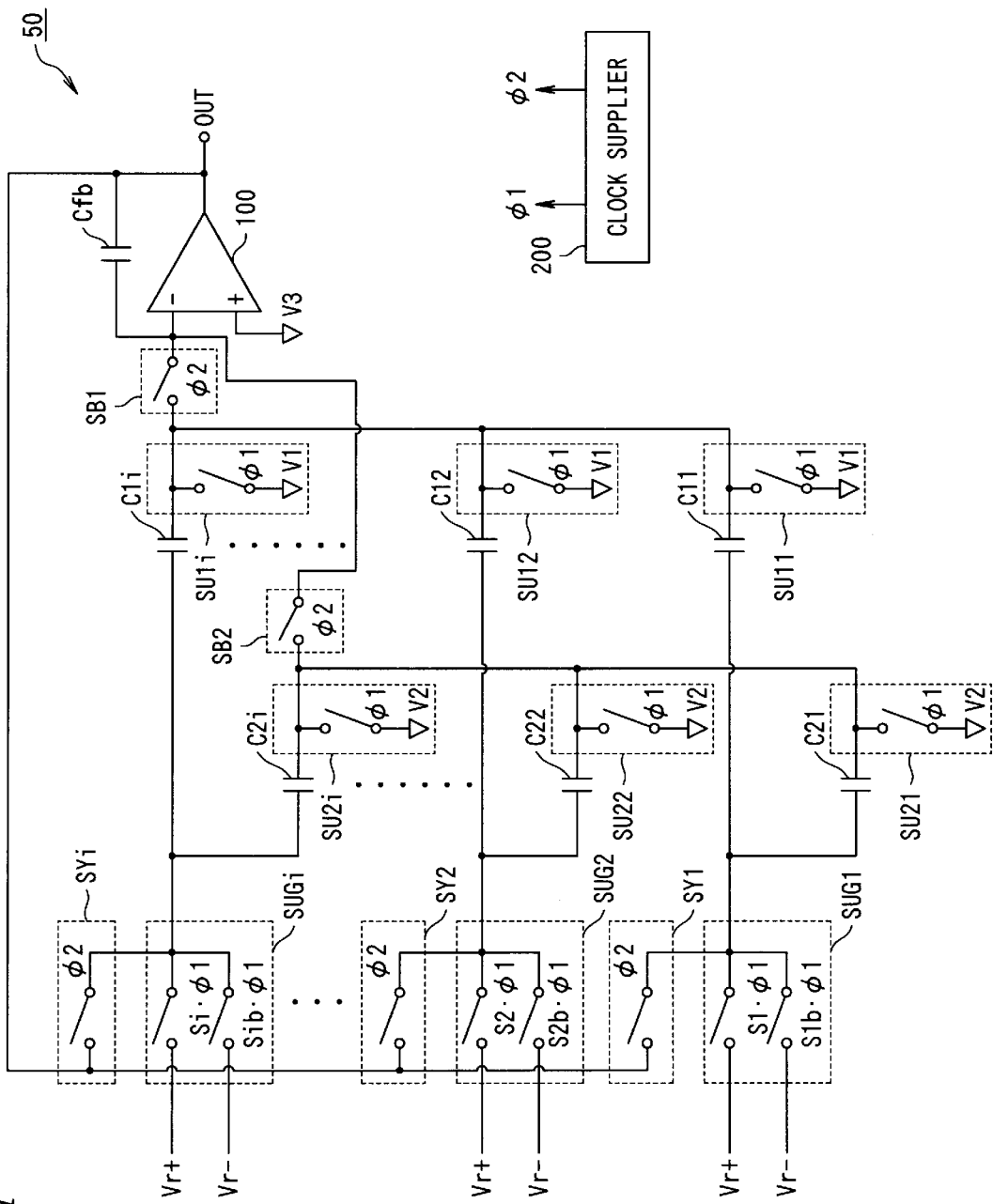
FIG. 1 is a circuit diagram showing an example of a D/A converter according to a first embodiment of the present invention.
Figure 7:
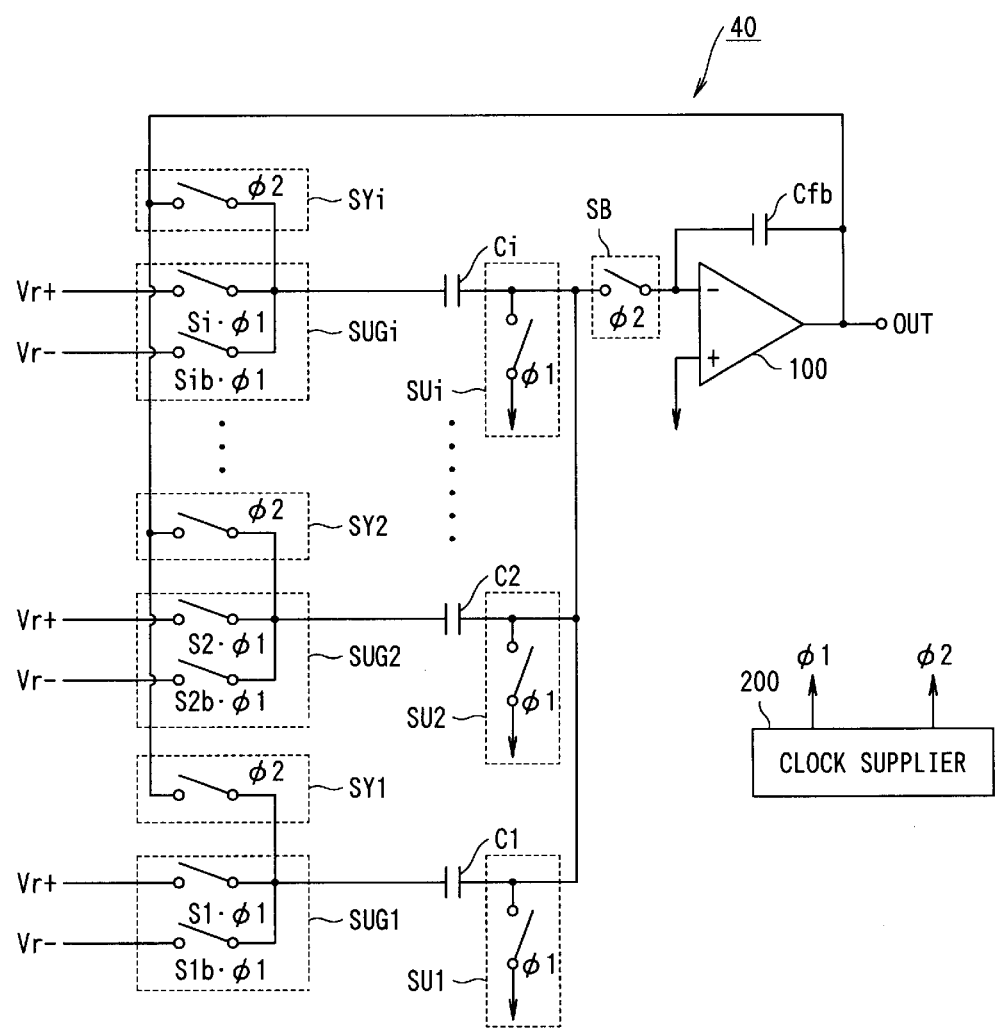
FIG. 7 is a circuit diagram showing an example of a conventional D/A converter.

FIG. 1 is a schematic circuit diagram showing a switched capacitor D/A converter 50 according to the first embodiment of the present invention. Those components which are the same as those of a conventional D/A converter 40 shown in FIG. 7 are denoted by the same reference numerals/characters as the corresponding components in FIG. 7.

The D/A converter 50 comprises an operational amplifier 100 whose output terminal and inverting input terminal are connected by a capacitive element Cfb and whose non-inverting input terminal is connected to an analog ground V3; capacitive elements C11 to C1$i$; a switch SB1 connected between the capacitive elements C11 to C1$i$ and the inverting input terminal of the operational amplifier 100; switches SU11 to SU1$i$ which connect the right terminals of the respective capacitive elements C11 to C1$i$, i.e., the terminals connected with the switch SB1, to the first analog ground V1. Hereinafter, a potential which serves as a reference when charges are sampled onto capacitive elements will be referred to as a sampling ground.

The D/A converter 50 further comprises capacitive elements C21 to C2$i$ which correspond to the capacitive elements C11 to C1$i$, respectively; a switch SB2 connected between the capacitive elements C21 to C2$i$ and the inverting input terminal of the operational amplifier 100; and switches SU21 to SU2$i$ which connect the right terminals of the respective capacitive elements C21 to C2i, i.e., the terminals connected with the switch SB2, to the second analog ground V2. Furthermore, the D/A converter 50 comprises switches SUG1 to SUGi which connect the left terminals of respective pairs of the capacitive elements C11 to C1i and capacitive elements C21 to C2i with one of reference voltages (Vr+ and Vr−); switches SY1 to SYi connected between the left terminals of respective pairs of the capacitive elements C11 to C1i and C21 to C2i, and the output terminal of the operational amplifier 100; and a clock supplier 200 which supplies two types of clock φ1 and φ2.

Figure 2:
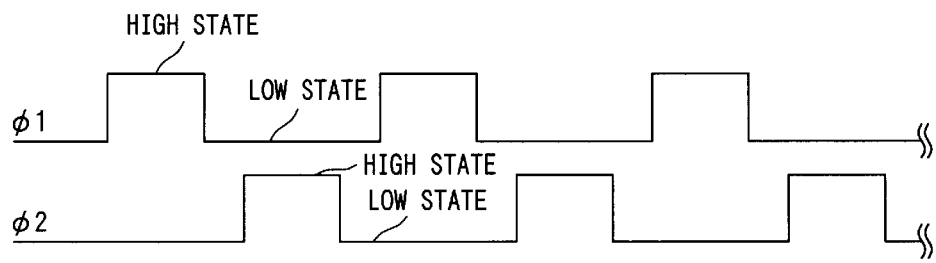
FIG. 2 is a timing chart of clocks generated by the clock supplier shown in FIG. 1.

As shown in FIG. 2, each of the two types of clock φ1 and φ2 supplied by the clock supplier 200 alternate low state and high state at predetermined intervals. When one clock is high, the other clock is low, so that high states of the two clocks never overlap.

The switches SU11 to SU1i and SU21 to SU2i conduct (ON) when the clock φ1 is in high state, but are nonconducting (OFF) otherwise. In FIG. 1, this is indicated by "φ1."

The switches SUG1 to SUGi connect the left terminals of the capacitive elements C11 to C1i and C21 to C2i with one of the reference voltages (Vr+ and Vr−) according to the polarity (+1 or −1) of 1-bit digital data S1 to Si inputted in the D/A converter 50. Specifically, if the x-th digital data is denoted by Sx, when the clock φ1 is in high state and the polarity of the digital data Sx is "+1," the reference voltage Vr+ is connected, and when the clock φ1 is in high state and the polarity of the digital data Sx is "−1," the reference voltage Vr− is connected. In FIG. 1, these conditions are indicated by "Sx·φ1" and "Sxb·φ1." Incidentally, "b" indicates logical inverse. On the other hand, when the clock φ1 is in low state, the switches are nonconducting (OFF).

The polarity of the digital data Sx is assumed to be "+1" when the value of the digital data Sx is "1," and "−1" when the data value is "0."

The switches SB1, SB2, and SY1 to SYi are conducting (ON) when the clock φ2 is in high state, but are nonconducting (OFF) otherwise. In FIG. 1, these conditions are indicated by "φ2."

Next, operation of the first embodiment will be described.

When the clock φ1 is in high state, the switches SU11 to SU1i and SU21 to SU2i turn on, the right terminals of the capacitive elements C11 to C1i, i.e., the terminals connected to the inverting input terminal of the operational amplifier 100, are connected to the sampling ground V1 while the right terminals of the capacitive elements C21 to C2i are connected to the sampling ground V2. Furthermore, the switches SUG1 to SUGi operate to connect the left terminals of respective pairs of the capacitive elements C11 to C1i and C21 to C2i with one of the reference voltages (Vr+ and Vr−) according to the polarity (+1 or −1) of the digital data S1 to Si. The capacitive elements C11 to C1i and C21 to C2i hold a charge corresponding to the difference between the reference voltage Vr+ or Vr− and the sampling ground V1 or V2. Specifically, each of the capacitive elements holds a charge corresponding to the appropriate one of the differences [Vr+]−V1, [Vr+]−V2, [Vr−]−V1, and [Vr−]−V2.

When the clock φ2 goes high, the switches SY1 to SYi turn on to connect the capacitive elements C11 to C1i and C21 to C2i between the output terminal (output potential: OUT) and inverting input terminal of the operational amplifier 100.

Also, when the clock φ2 goes high, the switches SB1 and SB2 turn on while the switches SUG1 to SUGi, SU11 to SU1i, and SU21 to SU2i turn off. Consequently, the charges held in the capacitive elements C11 to C1i and C21 to C2i while the clock φ1 was in high state are transferred to the feedback capacitive element Cfb of the operational amplifier 100 and integrated therein.

Then, charges are moved among the capacitive elements C11 to C1i, capacitive elements C21 to C2i, and the feedback capacitive element Cfb to redistribute the charges held by the capacitive elements.

It is assumed here that the value of Cfb is zero, that the total number of capacitive elements is 2·i (C11 to C1i and C21 to C2i), and that all the capacitive elements have the same capacitance value C0. Also, the midpoint of paired reference voltages Vr+ and Vr− as well as the midpoint of paired sampling grounds V1 and V2 are assumed to be (½)·VDD, i.e., ½ the supply voltage. Specifically, the reference voltage Vr+ is assumed to be higher than (½)·VDD by Vr0 (i.e., Vr+=(½)·VDD+Vr0), the reference voltage Vr− is assumed to be lower than (½)·VDD by Vr0 (i.e., Vr−=(½)·VDD−Vr0), the sampling ground V1 is assumed to be lower than (½)·VDD by Va (i.e., V1+=(½)·VDD−Va), and the sampling ground V2 is assumed to be higher than (½)·VDD by Va (i.e., V2+=(½)·VDD+Va).

Here, the potential difference between the reference voltage Vr+ and sampling ground V1 as well as the potential difference between the reference voltage Vr+ and sampling ground V2 are given by Eq. (1). Also, Eq. (2) holds.

$$\left.\begin{array}{l}[Vr+]-V1=-([Vr-]-V2)\equiv Vr1\\ [Vr+]-V2=-([Vr-]-V1)\equiv Vr2\end{array}\right\} \quad (1)$$

$$Vr1+Vr2=2\cdot5\cdot Vr0 \quad (2)$$

The total charge held by the capacitive elements C11 and C21 while the clock φ1 remains high is the same regardless of whether S1 is "1" or "−1." Namely, it is C0·S1·(Vr1+Vr2). Similarly, the total amount of charge held by the capacitive elements C12 and C22 is C0·S2·(Vr1+Vr2) and the total amount of charge held by the capacitive elements C1i and C2i is C0·Si·(Vr1+Vr2).

According to the law of conservation of charge, Eq. (3) holds between the total amount of charge held by the capacitive elements while the clock φ1 remains high and the total amount of charge held by the capacitive elements while the clock φ2 remains high, provided the output voltage of the operational amplifier 100 is OUT.

$$C0\cdot S1\cdot(Vr1+Vr2)+C0\cdot S2\cdot(Vr1+Vr2)+\ldots C0\cdot Si\cdot(Vr1+Vr2)= \quad (3)$$
$$OUT\cdot(C11+C12+\ldots+C1i+\ldots+C21+C22+\ldots+C2i)$$

Since C11 to C1i and C21 to C2i have the same capacitance value C0, Eq. (3) can be expressed as Eq. (4). This leads to Eq. (5).

$$C0\cdot(Vr1+Vr2)\cdot(S1+S2+\ldots Si)=OUT\cdot C0\cdot 2\cdot i \quad (4)$$

$$OUT=Vr0\cdot(S1+S2+\ldots+Se+Sf+\ldots+Si)/i \quad (5)$$

Thus, from Eq. (5), it follows that the switched capacitor D/A converter 50 shown in FIG. 1 is an i-bit linear level D/A converter.

This embodiment has the following effects.

Figure 8:
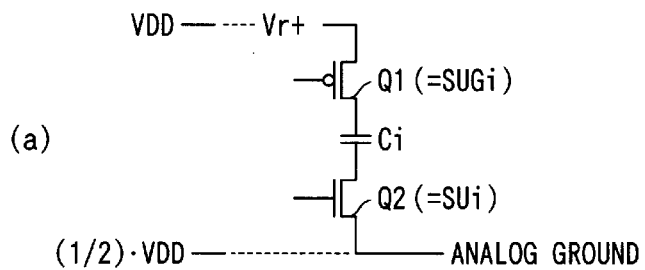
FIG. 8 is an explanatory diagram illustrating operation of the conventional D/A converter.
Figure 8:
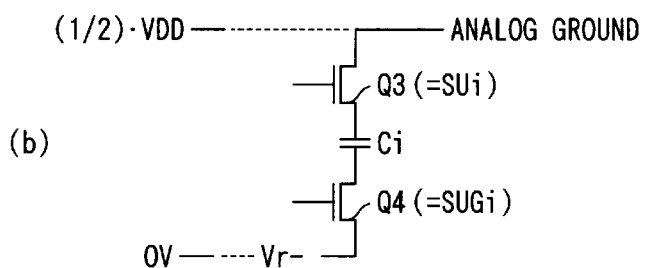
Figure 9:
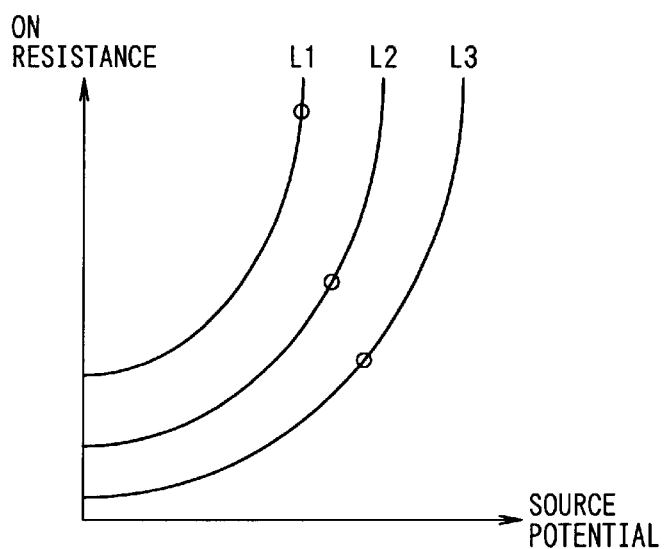
FIG. 9 is a characteristics diagram showing correspondence between source potential and ON resistance of n-channel MOS transistors at different supply voltages.

With the conventional i-bit linear level D/A converter 40 shown in FIG. 7, from FIG. 8A, Eq. (6) holds.

$$[Vr-(½)\cdot VDD]\cdot Ci-(½)\cdot VDD\cdot Ci=Vr\cdot Ci \quad (6)$$

Figure 3:
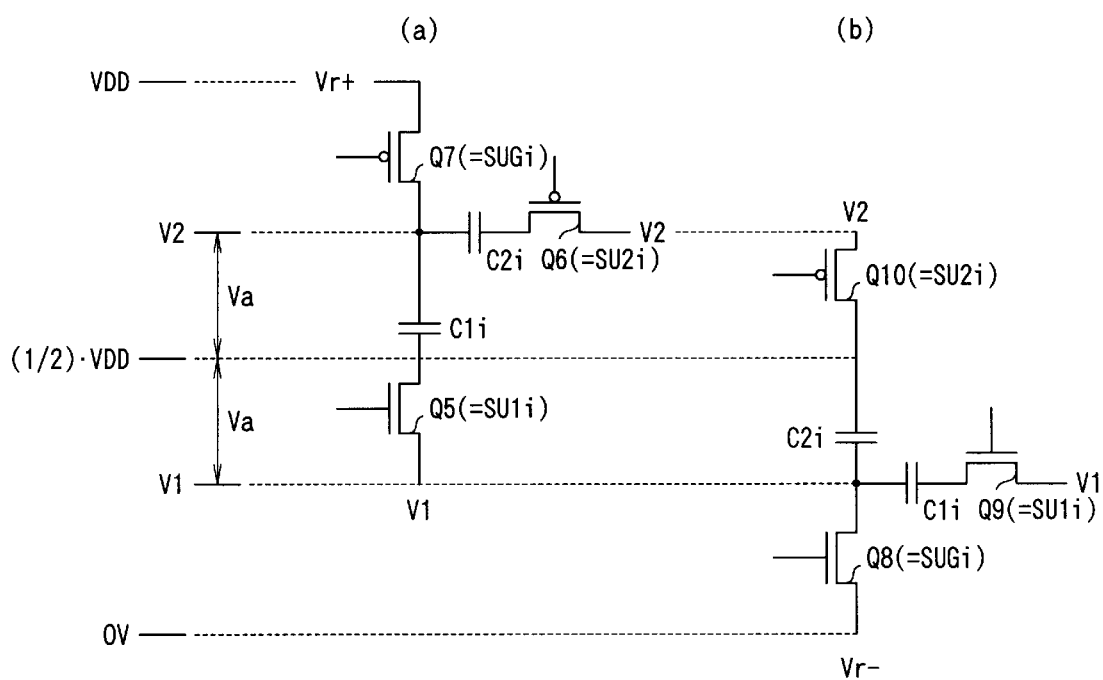
FIG. 3 is an explanatory diagram illustrating operation of the first embodiment.

On the other hand, with the D/A converter 50 shown in FIG. 1, from FIG. 3, Eqs. (7) and (8) hold. Thus, if Ci'=C1i=C2i, from Eqs. (7) and (8), the total charge is given by (9).

FIG. 3A and FIG. 3B show the potentials of various parts around the capacitive elements C1i and C2i when the reference voltage Vr+ is selected and when the reference voltage Vr− is selected, respectively.

$$([Vr+]-V1) \cdot C1i - (\tfrac{1}{2}) \cdot VDD \cdot C1i = ([Vr+] + Va) \cdot C1i \qquad (7)$$

$$([Vr+]-V2) \cdot C2i - (\tfrac{1}{2}) \cdot VDD \cdot C2i = ([Vr+] - Va) \cdot C2i \qquad (8)$$

The sum of the charges (7) + (8) = (9)

$$([Vr+] + Va) \cdot C1i + ([Vr+] - Va) \cdot C2i = [Vr+] \times 2 \cdot Ci'$$

Thus, whereas with the conventional D/A converter 40, the reference voltages Vr+ and Vr− are sampled at capacitance Ci to obtain a charge Vr·Ci as shown in Eq. (6), with the first embodiment, as shown in Eq. (8), the voltage ([Vr+]+Va) is sampled at capacitance Ci'/2 and the voltage ([Vr+]−Va) is sampled at capacitance Ci'/2 to obtain a charge equivalent to ([Vr+]+Va)·Ci'/2+([Vr+]−Va)·Ci'/2=[Vr+]·Ci'.

Thus, the D/A converter 50 can operate at a lower supply voltage than the conventional D/A converter 40.

Also, as described above, the D/A converter 50 is operated at the positive power supply potential VDD and the negative power supply potential 0 [V], the reference voltage Vr+ is set at VDD, the reference voltage Vr− is set at 0 [V], the sampling ground V1 is set at a potential lower than the midpoint ($\tfrac{1}{2}$)·VDD of the supply voltage by Va, and the sampling ground V2 is set at a potential higher than the midpoint potential ($\tfrac{1}{2}$)·VDD of the supply voltage by Va.

With the above configuration, out of the switches SUG1 to SUGi, p-channel MOS transistors can be used as the switches connected to the reference voltage Vr+ and n-channel MOS transistors can be used as the switches connected to the reference voltage Vr−. Also, n-channel MOS transistors can be used as the switches SU11 to SU1i connected to the sampling ground V1 and p-channel MOS transistors can be used as the switches SU21 to SU2i connected to the sampling ground V2.

FIG. 3 shows the potentials of various parts around capacitive elements when switches are composed of p-channel or n-channel MOS transistors. FIG. 3A shows a situation in which the digital data Sx is "1" and the clock φ1 is in high state while FIG. 3B shows a situation in which the digital data Sx is "−1" and the clock φ1 is in high state.

In FIG. 3A, a MOS switch Q5 corresponds to the switch SU1i in FIG. 1 while MOS switches Q6 and Q7 correspond to the switches SU2i and SUGi, respectively.

Similarly, in FIG. 3B, MOS switches Q8 and Q9 correspond to the switches SUGi and SU1i in FIG. 1, respectively, while a MOS switch Q10 corresponds to the switch SU2i.

As shown in FIG. 3A, since the MOS switch Q5 which connects the capacitive element C1i to the sampling ground V1 has a source potential of ($\tfrac{1}{2}$)·VDD−Va and a gate potential of VDD, the gate-source voltage VGS of the MOS switch Q5 is ($\tfrac{1}{2}$)·VDD+Va. Since the MOS switch Q5 does not turn on when the gate-source voltage VGS is not higher than the threshold voltage VT, the minimum supply voltage VDD for the MOS switch Q5 to perform sampling operations properly is VDD=2−(VT−Va).

Also, since the MOS switch Q6 which connects the capacitive element C2i to the sampling ground V2 has a source potential of ($\tfrac{1}{2}$)·VDD+Va and a gate potential of 0 [V], the gate-source voltage VGS of the MOS switch Q6 is |($\tfrac{1}{2}$)·VDD+Va|. Since the MOS switch Q6 does not turn on when the gate-source voltage VGS is not higher than the absolute value of the threshold voltage |VT|, the minimum supply voltage VDD for the MOS switch Q6 to perform sampling operations properly is VDD=2·(VT−Va).

Similarly, in FIG. 3B, since the MOS switch Q10 which connects the capacitive element C2i to the sampling ground V2 has a source potential of ($\tfrac{1}{2}$)·VDD+Va and a gate potential of 0 [V], the absolute value of the gate-source voltage VGS of the MOS switch Q10 is ($\tfrac{1}{2}$)·VDD+Va. Since the MOS switch Q10 does not turn on when the gate-source voltage VGS is not higher than the threshold voltage VT, the minimum supply voltage VDD for the MOS switch Q10 to perform sampling operations properly is VDD=2·(VT−Va).

Also, since the MOS switch Q9 which connects the capacitive element C1i to the sampling ground V1 has a source potential of ($\tfrac{1}{2}$)·VDD−Va and a gate potential of VDD, the gate-source voltage VGS of the MOS switch Q9 is ($\tfrac{1}{2}$)·VDD+Va. Since the MOS switch Q9 does not turn on when the gate-source voltage VGS is not higher than the absolute value of the threshold voltage |VT|, the minimum supply voltage VDD for the MOS switch Q9 to perform sampling operations properly is VDD=2·(VT−Va).

In this way, while the minimum operating supply voltage for the conventional D/A converter 40 shown in FIG. 7 is 2·VT, the D/A converter 50 shown in FIG. 1 can set the minimum supply voltage to a lower value, 2·(VT−Va).

Incidentally, p-channel MOS transistors and n-channel MOS transistors may have different threshold voltages VT. Then, the minimum supply voltage is determined based on the higher threshold voltage VT. Even in that case, the minimum supply voltage can be set at a lower value than 2·VT of the conventional D/A converter 40.

Incidentally, if Va=($\tfrac{1}{2}$)·VDD and if the sampling ground V1 is set at 0 [V] and the sampling ground V2 is set at VDD, the minimum operating supply voltage can be set at a lower value.

Figure 4:
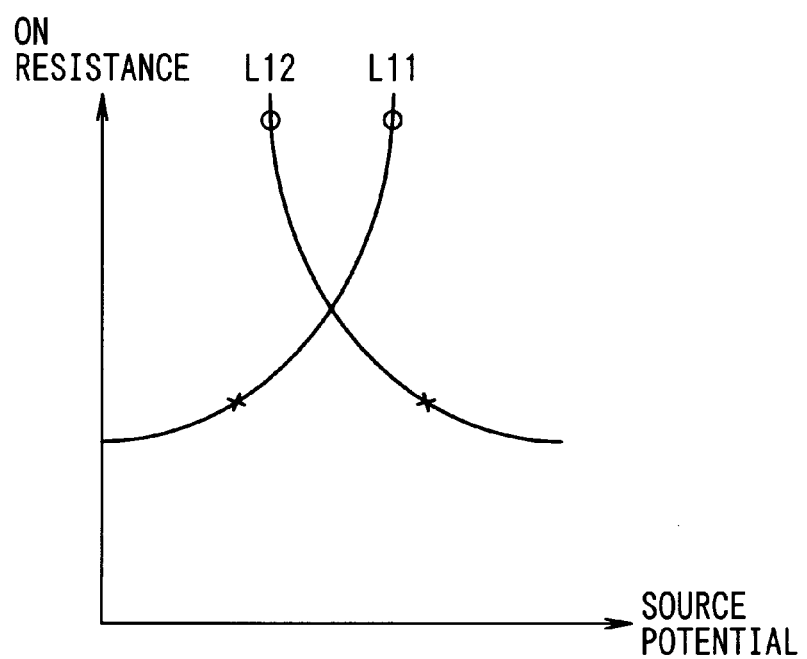
FIG. 4 is a characteristics diagram showing correspondence between source potential and ON resistance of MOS transistors.

FIG. 4 shows the ON resistance (L11) of n-channel MOS transistors and the ON resistance (L12) of p-channel MOS transistors when the source potential is changed. The horizontal axis represents the source potential while the vertical axis represents the ON resistance. The ○ marks on the characteristic lines L11 and L12 indicate the ON resistances at a source voltage of ½ the supply voltage VDD while the × marks on the characteristic lines L11 and L12 indicate the potential V1=($\tfrac{1}{2}$)·VDD−Va which serves as the operating point of the n-channel MOS transistors (Q5 and Q9) and the potential V2=($\tfrac{1}{2}$)·VDD+Va which serves as the operating point of the p-channel MOS transistors (Q6 and Q10). Incidentally, the characteristic lines L11 and L12 indicate the ON resistances at different supply voltages VDD.

In FIG. 4, on the characteristic lines L11 and L12, when the ON resistance at the points indicated by the ○ marks and the ON resistance at the points indicated by × marks are compared, the ON resistance at the points indicated by the × marks is lower. Thus, the size of MOS transistors needed to sample charges properly within a predetermined period of time can be reduced.

Smaller MOS transistors reduce the feed-through noise produced when the gate voltage changes during sampling of charges and the switches are turned off, and decrease variations in the amount of charge among samplings, resulting in less harmonic components and noise components in output signals.

Referring to FIG. 1, the switches SB1 and SB2 must turn on and off reliably in order for the D/A converter 50 to operate. Since their source potential is equal to the analog ground V3, the switches can be operated reliably either by using n-channel MOS transistors for the switches SB1 and SB2 and setting the analog ground V3 sufficiently lower than (½)·VDD or by using p-channel MOS transistors for the switches SB1 and SB2 and setting the analog ground V3 sufficiently higher than (½)·VDD.

Figure 6:
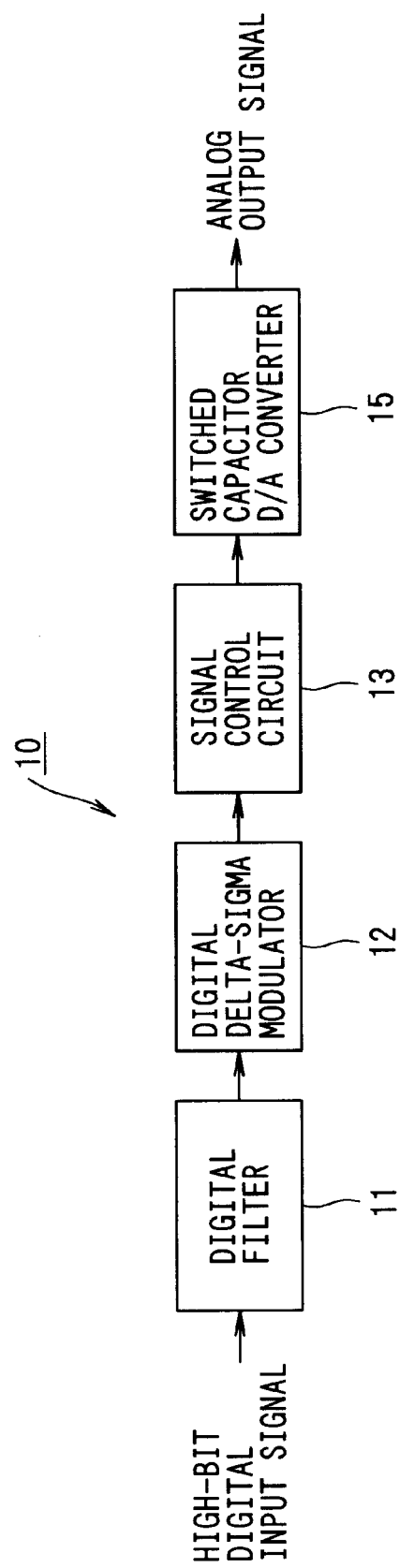
FIG. 6 is a block diagram showing an example of a signal converter equipped with a D/A converter.

If the analog ground V3 is set lower than (½)·VDD, the switches SY1 to SYi can be composed of either n-channel MOS transistors or an n-channel MOS transistor and p-channel MOS transistor connected in parallel by setting the feedback gain of the digital delta-sigma modulator 12 provided in a stage preceding the capacitor D/A converter 15 (as shown in FIG. 6, for example) to a value sufficiently larger than "1," reducing the amplitude of analog output signals appropriately, and putting the potential of the analog output signals, which serves as the source potential, in a range sufficiently lower than (½)·VDD.

Similarly, if the analog ground V3 is set higher than (½)·VDD, the switches SY1 to SYi can be composed of either p-channel MOS transistors or an n-channel MOS transistor and p-channel MOS transistor connected in parallel by setting the feedback gain of the digital delta-sigma modulator 12 (as shown in FIG. 6, for example) to a value sufficiently larger than "1," reducing the amplitude of analog output signals appropriately, and putting the potential of the analog output signals, which serves as the source potential, in a range sufficiently higher than (½)·VDD.

Next, a second embodiment of the present invention will be described.

The second embodiment uses a fully differential circuit configuration whereas the operational amplifier 100 according to the first embodiment has a single-ended circuit configuration.

Figure 5:
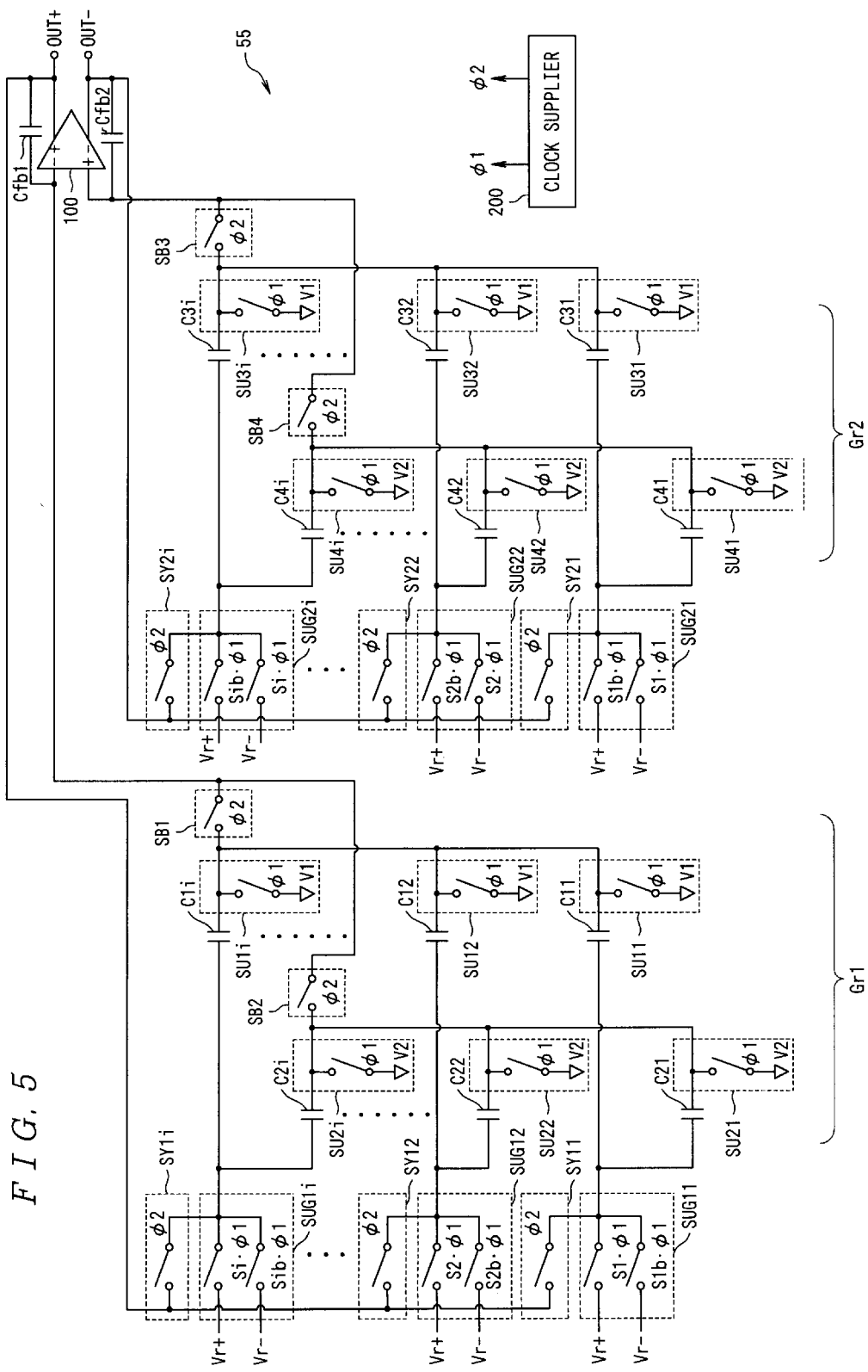
FIG. 5 is a circuit diagram showing an example of a D/A converter according to a second embodiment of the present invention.

As shown in FIG. 5, a D/A converter 55 according to the second embodiment comprises an operational amplifier 100 whose non-inverting output terminal (OUT+) and inverting input terminal are connected by a capacitive element Cfb1 and whose inverting output terminal (OUT−) and non-inverting input terminal are connected by a capacitive element Cfb2; capacitive elements C11 to C1$i$ on the side of the non-inverting output terminal; capacitive elements C21 to C2$i$ which correspond to the capacitive elements C11 to C1$i$, respectively; a switch SB1 connected between the respective capacitive elements C11 to C1$i$ and the inverting input terminal of the operational amplifier 100; switches SU11 to SU1$i$ which connect the right terminals of the respective capacitive elements C11 to C1$i$ with a sampling ground V1; a switch SB2 connected between the respective capacitive elements C21 to C2$i$ and the inverting input terminal of the operational amplifier 100; switches SU21 to SU2$i$ which connect the right terminals of the respective capacitive elements C21 to C2$i$ with a sampling ground V2; switches SUG11 to SUG1$i$ which connect the left terminals of respective pairs of the capacitive elements C11 to C1$i$ and capacitive elements C21 to C2$i$ with one of reference voltages (Vr+ and Vr−); switches SY11 to SY1$i$ connected between the left terminals of respective pairs of the capacitive elements C11 to C1$i$ and C21 to C2$i$, and the non-inverting output terminal of the operational amplifier 100.

The D/A converter 55 further comprises capacitive elements C31 to C3$i$ on the side of the inverting output terminal; capacitive elements C41 to C4$i$ which correspond to the capacitive elements C31 to C3$i$, respectively; a switch SB3 connected between the respective capacitive elements C31 to C3$i$ and the non-inverting input terminal of the operational amplifier 100; switches SU31 to SU3$i$ which connect the right terminals of the respective capacitive elements C31 to C3$i$ with the sampling ground V1; a switch SB4 connected between the respective capacitive elements C41 to C4$i$ and the non-inverting input terminal of the operational amplifier 100; switches SU41 to SU4$i$ which connect the right terminals of the respective capacitive elements C41 to C4$i$ with the sampling ground V2; switches SUG21 to SUG2$i$ which connect the left terminals of respective pairs of the capacitive elements C31 to C3$i$ and C41 to C4$i$ with one of reference voltages (Vr+ and Vr−); switches SY21 to SY2$i$ connected between the left terminals of respective pairs of the capacitive elements C31 to C3$i$ and C41 to C4$i$, and the inverting output terminal of the operational amplifier 100; and a clock supplier 200 which supplies two types of clock φ1 and φ2.

As is the case with the first embodiment, the switches SUG11 to SUG1$i$ connect the left terminals of the capacitive elements C11 to C1$i$ and C21 to C2$i$ with one of the reference voltages (Vr+ and Vr−) according to the polarity (+1 or −1) of inputted 1-bit digital data S1 to Si. Specifically, when the clock φ1 is in high state and the polarity of the digital data Sx is "+1," the reference voltage Vr+ is connected, and when the clock φ1 is in high state and the polarity of the digital data Sx is "−1," the reference voltage Vr− is connected. When the clock φ1 is in low state, the switches are nonconducting (OFF).

On the other hand, the switches SUG21 to SUG2$i$ connect the left terminals of the capacitive elements C31 to C3$i$ and C41 to C4$i$ with one of the reference voltages (Vr+ and Vr−) according to the polarity (+1 or −1) of the digital data S1 to Si. Specifically, when the clock φ1 is in high state and the polarity of the digital data Sx is "+1," the reference voltage Vr− is connected, and when the clock φ1 is in high state and the polarity of the digital data Sx is "−1," the reference voltage Vr+ is connected. When the clock φ1 is in low state, the switches are nonconducting (OFF).

It is assumed here that the polarity of the digital data Sx is "+1" when the value of the digital data Sx is "1," and that the polarity is "−1" when the data value is "0."

The switches SB1 to SB4, SY11 to SY1$i$, and SY21 to SY2$i$ are conducting (ON) when the clock φ2 is in high state, but are nonconducting (OFF) otherwise.

Next, operation of the second embodiment will be described.

The D/A converter 55 according to the second embodiment operate similarly to the D/A converter 50 according to the first embodiment. However, in the D/A converter 55, a capacitive element group Gr1 on the side of the non-inverting output terminal consisting of the capacitive elements C11 to C1$i$ and C21 to C2$i$ connected with the non-inverting output terminal of the operational amplifier 100 and a capacitive element group Gr2 on the side of the inverting output terminal consisting of the capacitive elements C31 to C3$i$ and C41 to C4$i$ connected with the inverting output terminal of the operational amplifier 100 have charges of opposite polarity when the clock φ1 is in high state. When the clock φ2 is in high state, the capacitive element group Gr1 on the side of the non-inverting output terminal is connected between the non-inverting output terminal and inverting input terminal of the operational amplifier 100 and the capacitive element group Gr2 on the side of the inverting output terminal is connected between the inverting output terminal and non-inverting input terminal of the operational amplifier 100.

Consequently, the charges held in the capacitive element group Gr1 on the side of the non-inverting output terminal and the capacitive element group Gr2 on the side of the inverting output terminal when the clock φ1 is in high state are transferred to the feedback capacitive elements Cfb1 and Cfb2 of the operational amplifier 100 and integrated therein. Then, charges are moved between the capacitive elements in the capacitive element group Gr1 on the side of the non-inverting output terminal and the feedback capacitive element Cfb1 as well as between the capacitive elements in the capacitive element group Gr2 on the side of the inverting output terminal and the feedback capacitive element Cfb2 to redistribute the charges held by the capacitive elements, as is the case with the first embodiment.

Here, since the capacitive element group Gr1 on the side of the non-inverting output terminal and the capacitive element group Gr2 on the side of the inverting output terminal hold charges of opposite polarity, the differences between the output voltages of the output terminals on the side of the non-inverting output terminal and output voltages of output terminals on the side of the inverting output terminal constitute actual output signals, resulting in fully differential analog output signals.

Again in the second embodiment, the D/A converter 55 is operated at the positive power supply potential VDD and the negative power supply potential 0 [V], the reference voltage Vr+ is set at VDD, the reference voltage Vr− is set at 0 [V], the sampling ground V1 is set at a potential lower than the midpoint potential (½)·VDD of the supply voltage by Va, and the sampling ground V2 is set at a potential higher than the midpoint potential (½)·VDD of the supply voltage by Va.

With the above configuration, as with the first embodiment, out of the switches SUG11 to SUG1$i$ and SUG21 to SUG2$i$, p-channel MOS transistors can be used as the switches connected to the reference voltage Vr+ and n-channel MOS transistors can be used as the switches connected to the reference voltage Vr−. Also, n-channel MOS transistors can be used as the switches SU11 to SU1$i$ and SU31 to SU3$i$ connected to the sampling ground V1 and p-channel MOS transistors can be used as the switches SU21 to SU2$i$ and SU41 to SU4$i$ connected to the sampling ground V2.

Thus, again, as with the first embodiment, smaller MOS transistors can be used for MOS switches. This reduces the feed-through noise produced when the gate voltage changes during sampling of charges and the switches are turned off and decreases variations in the amount of charge among samplings.

Also, on the non-inverting output side and inverting output side of the operational amplifier 100 which pair up with each other, feed-through noises during sampling are of the same polarity and equivalent, and thus the feed-through noises which appear in the differential output signals of the operational amplifier 100 are canceled out. Only a slight amount of error components remains of the feed-through noises canceled out. The error components are smaller than when large MOS switches are used. This results in less harmonic components and noise components in output signals.

When the first and second embodiments are actually implemented, for example, as large-scale integrated circuits, timing adjustments can be made so that the switches SU11 to SU4$i$ and SB1 to SB4 connected with the sampling ground V1 or V2 and operated in synchronization with the clock φ1 or φ2 will turn off slightly earlier than other switches and adjustments can be made so that the feed-through noise when digital data Sx is "1" and the feed-through noise when digital data Sx is "−1" will be equivalent. However, in the first and second embodiments, the use of smaller MOS switches can reduce the feed-through noises. Thus, a processing unit for driving the above-mentioned switches can be implemented easily without increasing the processing load needed to make the timing adjustments.

In the first and second embodiments described above, the switched capacitor D/A converter is used as a stand-alone unit. However, the switched capacitor D/A converter 50 or 55 according to the first or second embodiments may be used as the switched capacitor D/A converter 15 shown in FIG. 6 in a so-called delta-sigma D/A converter. In this way, a delta-sigma D/A converter containing a D/A converter which operates at a lower supply voltage can be implemented easily.

Incidentally, in the embodiments described above, the sampling grounds used are V1=(½)·VDD−Va and V2=(½)·VDD+Va, but this is not restrictive. Any sampling grounds may be used as long as they satisfy V1=([Vr+]+[Vr−])/2−Va and V2=([Vr+]+[Vr−])/2+Va (where Va is an arbitrary value).

In the first embodiment described above, the first period corresponds to the period when the clock φ1 is in high state, the second period corresponds to the period when the clock φ2 is in high state, the reference voltages Vr+ and Vr− correspond to charge-holding supply voltages, the sampling ground V1 corresponds to a first reference voltage, the capacitive elements C11 to C1$i$ correspond to first capacitive elements, the sampling ground V2 corresponds to a second reference voltage, the capacitive elements C21 to C2$i$ correspond to second capacitive elements, and the switches SY1 to SY$i$, SB1, and SB2 correspond to switching means.

Also, in the second embodiment described above, the first period corresponds to the period when the clock φ1 is in high state, the second period corresponds to the period when the clock φ2 is in high state, the reference voltages Vr+ and Vr− correspond to charge-holding supply voltages, the sampling ground V1 corresponds to a first reference voltage, the capacitive elements C11 to C1$i$ correspond to first capacitive elements, the capacitive elements C31 to C3$i$ correspond to third capacitive elements, the sampling ground V2 corresponds to a second reference voltage, the capacitive elements C21 to C2$i$ correspond to second capacitive elements, the capacitive elements C41 to C4$i$ correspond to fourth capacitive elements, the switches SY11 to SY1$i$, SB1, and SB2 correspond to first switching means, and the switches SY21 to SY2$i$, SB3, and SB4 correspond to second switching means.

What is claimed is:

1. A D/A converter for converting a given digital signal into an analog signal, comprising:
    a first capacitive element for holding a charge corresponding to difference between a charge-holding supply voltage and a first reference voltage based on the given digital signal during a first period;
    a second capacitive element for holding a charge corresponding to difference between the charge-holding supply voltage and a second reference voltage different from the first reference voltage based on the given digital signal during the first period; and
    switching means which connects the first and second capacitive elements between an input terminal and output terminal of an operational amplifier during a second period.

2. A D/A converter for converting a given digital signal into an analog signal, comprising:
    a first capacitive element for holding a charge corresponding to difference between a charge-holding supply voltage and a first reference voltage based on the given digital signal during a first period;

a second capacitive element for holding a charge corresponding to difference between the charge-holding supply voltage and a second reference voltage different from the first reference voltage based on the given digital signal during the first period;

first switching means which connects the first and second capacitive elements between an inverting input terminal and non-inverting output terminal of an operational amplifier during a second period;

a third capacitive element for holding a charge corresponding to the difference between the charge-holding supply voltage and the first reference voltage based on the given digital signal during the first period; and a fourth capacitive element for holding a charge corresponding to the difference between the charge-holding supply voltage and the second reference voltage based on the given digital signal during the first period; and second switching means which connects the third and fourth capacitive elements between a non-inverting input terminal and inverting output terminal of the operational amplifier during the second period.

3. The D/A converter according to claim 1 or 2, wherein the switching means comprises MOS transistor.

4. The D/A converter according to claim 1 or 2, wherein the first reference voltage is a supply voltage and the second reference voltage is a ground voltage.

5. A delta-sigma D/A converter for converting a digital signal sampled at a predetermined sampling frequency into an analog signal, comprising:

a digital filter which converts the digital signal into a second digital signal with a higher frequency than a sampling frequency by interpolating it;

a digital delta-sigma modulator which converts the second digital signal into a lower-bit third digital signal using noise shaping; and a D/A converter which performs digital-analog conversion, wherein the D/A converter comprises:
a first capacitive element for holding a charge corresponding to difference between a charge-holding supply voltage and a first reference voltage based on the third digital signal during a first period;
a second capacitive element for holding a charge corresponding to difference between the charge-holding supply voltage and a second reference voltage different from the first reference voltage based on the third digital signal during the first period; and
switching means which connects the first and second capacitive elements between an input terminal and output terminal of an operational amplifier during a second period.

6. A delta-sigma D/A converter for converting a digital signal sampled at a predetermined sampling frequency into an analog signal, comprising:

a digital filter which converts the digital signal into a second digital signal with a higher frequency than a sampling frequency by interpolating it;

a digital delta-sigma modulator which converts the second digital signal into a lower-bit third digital signal using noise shaping; and a D/A converter which performs digital-analog conversion, wherein the D/A converter comprises:
a first capacitive element for holding a charge corresponding to difference between a charge-holding supply voltage and a first reference voltage based on the third digital signal during a first period;
a second capacitive element for holding a charge corresponding to difference between the charge-holding supply voltage and a second reference voltage different from the first reference voltage based on the third digital signal during the first period; and
first switching means which connects the first and second capacitive elements between an input terminal and output terminal of an operational amplifier during a second period;
a third capacitive element for holding a charge corresponding to the difference between the charge-holding supply voltage and the first reference voltage based on the third digital signal during the first period; and a fourth capacitive element for holding a charge corresponding to the difference between the charge-holding supply voltage and the second reference voltage based on the third digital signal during the first period; and
second switching means which connects the third and fourth capacitive elements between a non-inverting input terminal and inverting output terminal of the operational amplifier during the second period.

7. The delta-sigma D/A converter according to claim 5 or 6, wherein the switching means comprises MOS transistor.

8. The delta-sigma D/A converter according to claim 5 or 6, wherein the first reference voltage is a supply voltage and the second reference voltage is a ground voltage.

* * * * *